(12) United States Patent
Zhang

(10) Patent No.: US 10,810,963 B2
(45) Date of Patent: Oct. 20, 2020

(54) SHIFT REGISTER AND METHOD FOR DRIVING THE SAME, GATE DRIVING CIRCUIT AND DISPLAY DEVICE

(71) Applicants: ORDOS YUANSHENG OPTOELECTRONICS CO., LTD., Ordos, Inner Mongolia (CN); BOE TECHNOLOGY GROUP CO., LTD., Beijing (CN)

(72) Inventor: Jie Zhang, Beijing (CN)

(73) Assignees: ORDOS YUANSHENG OPTOELECTRONICS CO., LTD., Oros, Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/607,569

(22) PCT Filed: Mar. 26, 2019

(86) PCT No.: PCT/CN2019/079660
§ 371 (c)(1),
(2) Date: Oct. 23, 2019

(87) PCT Pub. No.: WO2019/184905
PCT Pub. Date: Oct. 3, 2019

(65) Prior Publication Data
US 2020/0143766 A1 May 7, 2020

(30) Foreign Application Priority Data

Mar. 27, 2018 (CN) .......................... 2018 1 0257525

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2300/0426* (2013.01); *G09G 2300/0842* (2013.01); *G09G 2310/0286* (2013.01)

(58) Field of Classification Search
CPC .............. G09G 3/2092; G09G 3/3677; G09G 2300/0426; G06F 3/0416; G11C 19/28
(Continued)

(56) References Cited

U.S. PATENT DOCUMENTS 8,605,029 B2 12/2013 Ohhashi
9,779,680 B2 10/2017 Hao et al.
(Continued)

FOREIGN PATENT DOCUMENTS

CN 102460587 A 5/2012
CN 102915698 A 3/2013
(Continued)

OTHER PUBLICATIONS

1st office action dated May 27, 2019 in counterpart CN201810257525.1 with English Translation.
(Continued)

*Primary Examiner* — Calvin C Ma
(74) *Attorney, Agent, or Firm* — Nath, Goldberg & Meyer; Joshua B. Goldberg

(57) ABSTRACT

A shift register and a method for driving the same, a gate driving circuit and a display device are provided, the shift register comprising: an input sub-circuit, an output sub-circuit, a pull-down control sub-circuit, a pull-down sub-circuit, a first reset sub-circuit, and a second reset a sub-circuit, wherein the input sub-circuit and the output sub-circuit are electrically coupled to a pull-up node, the pull-down control sub-circuit, the pull-down sub-circuit, the first reset sub-circuit and the second reset sub-circuit are elec-
(Continued)

trically coupled to a pull-down node, the first reset sub-circuit is electrically coupled to the input sub-circuit, and the second reset sub-circuit and the output sub-circuit are both electrically coupled to a signal output terminal.

20 Claims, 4 Drawing Sheets

(58) Field of Classification Search
 USPC .......................................................... 345/100
 See application file for complete search history.

(56) References Cited

U.S. PATENT DOCUMENTS

| | | | |
|---|---|---|---|
| 10,032,424 B2 | 7/2018 | Xu | |
| 10,269,282 B2 * | 4/2019 | Shan | ........................ G09G 3/20 |
| 10,573,224 B2 * | 2/2020 | Hao | ....................... G06F 3/0418 |
| 2018/0233099 A1 | 8/2018 | Wang et al. | |
| 2019/0189234 A1 | 6/2019 | Chen et al. | |

FOREIGN PATENT DOCUMENTS

| | | |
|---|---|---|
| CN | 103366704 A | 10/2013 |
| CN | 106023949 A | 10/2016 |
| CN | 106940977 A | 7/2017 |
| CN | 107154236 A | 9/2017 |
| CN | 107256701 A | 10/2017 |
| CN | 107403610 A | 11/2017 |
| CN | 108399902 A | 8/2018 |
| EA | 032171 B1 | 4/2019 |

OTHER PUBLICATIONS

2nd office action dated Jan. 10, 2020 in counterpart CN201810257525.1 with English translation.

* cited by examiner

SHIFT REGISTER AND METHOD FOR DRIVING THE SAME, GATE DRIVING CIRCUIT AND DISPLAY DEVICE

CROSS-REFERENCE TO RELATED APPLICATIONS

This is a National Phase Application filed under 35 U.S.C. 371 as a national stage of PCT/CN2019/079660, filed Mar. 26, 2019, an application claiming the priority of Chinese Patent Application No. 201810257525.1, entitled "Shift register and method of driving the same, gate driving circuit and display device", filed on Mar. 27, 2018, in the Chinese Intellectual Property Office, the disclosure of each of which is incorporated herein in its entirety by reference.

TECHNICAL FIELD

The present disclosure relates to the technology field of display, and in particular, to a shift register and a method for driving the same, a gate driving circuit and a display device.

BACKGROUND

A driving circuit for a thin film transistor liquid crystal display (TFT-LCD) mainly includes a data driving circuit and a gate driving circuit. The gate driving circuit may be disposed in a display panel in a package manner of Chip on film (COF) or Chip on glass (COG), or may be formed in a display panel in a form of an integrated circuit consisting of TFTs.

As the development of panel display and increasingly fierce market competition, improvements of technical capability and performance quality of a gate driver on array (GOA) circuit is becoming particularly urgent, and stability of a GOA circuit is also a key index in overcoming the technical barrier in the performance of the GOA circuit.

SUMMARY

According to an embodiment of the present disclosure, there is provided a shift register including an input sub-circuit, an output sub-circuit, a pull-down control sub-circuit, a pull-down sub-circuit, a first reset sub-circuit, a second reset sub-circuit, a signal input terminal, a high-level signal terminal, a low-level signal terminal, a reset signal terminal, a signal output terminal, a first clock signal terminal and a second clock signal terminal, where the input sub-circuit is configured to charge, under the control of an input signal provided from the signal input terminal, a pull-up node, which is a connection node between the input sub-circuit and the output sub-circuit; the output sub-circuit is configured to output, under the control of a potential of the pull-up node, a first clock signal provided from the first clock signal terminal through the signal output terminal; the pull-down control sub-circuit is configured to charge, under the control of the first clock signal provided from the first clock signal terminal and a second clock signal provided from the second clock signal terminal, a pull-down node, which is a connection node between the pull-down control sub-circuit, the pull-down sub-circuit, the first reset sub-circuit, and the second reset sub-circuit; the pull-down sub-circuit is configured to pull-down, under the control of the input signal provided from the signal input terminal, a potential of the pull-down node by a low level signal provided from the low-level signal terminal; the first reset sub-circuit is configured to discharge, under the control of the potential of the pull-down node, the pull-up node by the low level signal provided from the low-level signal terminal; and the second reset sub-circuit is configured to discharge, under the control of the potential of the pull-down node and a reset signal provided from the reset signal terminal, the signal output terminal by the low level signal provided from the low-level signal terminal.

In some implementations, the pull-down control sub-circuit includes a first transistor, a second transistor, and a second storage capacitor, where a first electrode of the first transistor is electrically coupled to the high-level signal terminal, a second electrode of the first transistor is electrically coupled to a first electrode of the second transistor, and a control electrode of the first transistor is electrically coupled to the first clock signal terminal; the first electrode of the second transistor is electrically coupled to the second electrode of the first transistor, a second electrode of the second transistor is electrically coupled to the pull-down node, and a control electrode of the second transistor is electrically coupled to the second clock signal terminal; a first terminal of the second storage capacitor is electrically coupled to the low-level signal terminal, and a second terminal of the second storage capacitor is electrically coupled between the second electrode of the first transistor and the first electrode of the second transistor.

In some implementations, the pull-down sub-circuit includes a sixth transistor, a first electrode of the sixth transistor is electrically coupled to the pull-down node, a second electrode of the sixth transistor is electrically coupled to the low-level signal terminal, and a control electrode of the sixth transistor is electrically coupled to the signal input terminal.

In some implementations, the input sub-circuit includes a seventh transistor, a first electrode and a control electrode of the seventh transistor are both electrically coupled to the signal input terminal, and a second electrode of the seventh transistor is electrically coupled to the pull-up node and the first reset sub-circuit.

In some implementations, the input sub-circuit further includes an eighth transistor, a first electrode of the eighth transistor is electrically coupled to the second electrode of the seventh transistor and the first reset sub-circuit, a second electrode of the eighth transistor is electrically coupled to the pull-up node, and a control electrode of the eighth transistor is electrically coupled to the high-level signal terminal.

In some implementations, the output sub-circuit includes a third transistor and a first storage capacitor, a first electrode of the third transistor is electrically coupled to the first clock signal terminal, a second electrode of the third transistor is electrically coupled to a second terminal of the first storage capacitor and the signal output terminal, and a control electrode of the third transistor is electrically coupled to the pull-up node and a first terminal of the first storage capacitor.

In some implementations, the first reset sub-circuit includes a fifth transistor, a first electrode of the fifth transistor is electrically coupled to the pull-up node via the input sub-circuit, a second electrode of the fifth transistor is electrically coupled to the low-level signal terminal, and a control electrode of the fifth transistor is electrically coupled to the pull-down node.

In some implementations, the second reset sub-circuit includes a fourth transistor and a ninth transistor, a first electrode of the fourth transistor is electrically coupled to the signal output terminal, a second electrode of the fourth transistor is electrically coupled to the low-level signal terminal, and a control electrode of the fourth transistor is electrically coupled to a first electrode of the ninth transistor and the pull-down node; the first electrode of the ninth transistor is electrically coupled to the control electrode of the fourth transistor and the pull-down node, a second electrode of the ninth transistor is electrically coupled to the high-level signal terminal, and a control electrode of the ninth transistor is electrically coupled to the reset signal terminal.

In some implementations, the shift register further includes a third storage capacitor, a first terminal of the third storage capacitor is electrically coupled to the low-level signal terminal, and a second terminal of the third storage capacitor is electrically coupled to the pull-down node.

According to an embodiment of the present disclosure, there is provided a gate driving circuit including a plurality of shift registers which are cascaded, and each of the shift registers is the shift register described above, a signal input terminal of a shift register of a current stage is electrically coupled to a signal output terminal of a shift register of a previous stage; a reset signal terminal of the shift register of the current stage is electrically coupled to a signal output terminal of a shift register of a next stage.

According to an embodiment of the present disclosure, there is provided a display device including the gate driving circuit described above.

According to an embodiment of the present disclosure, there is provided a method for driving the shift register described above, the method including a first stage, a second stage and a third stage, where, in the first stage, charging, by the input sub-circuit, the pull-up node, and charging, by the pull-down sub-circuit, the pull-clown node, under the control of the input signal provided from the signal input terminal; in the second stage, outputting, by the output sub-circuit, the first clock signal provided from the first clock signal terminal through the signal output terminal, under the control of a potential of the pull-up node; and storing, by the pull-down control sub-circuit, energy by using the high level signal provided from the high-level signal terminal, under the control of the first clock signal provided from the first clock signal terminal; in the third stage, pulling up the potential of the pull-down node and enabling the first reset sub-circuit to operate to reset the pull-up node with the low level signal provided from the low-level signal terminal, under the control of the second clock signal provided from the second clock signal terminal; and resetting, by the second reset sub-circuit, the signal output terminal with the low level signal provided from the low-level signal terminal, under the control of the reset signal provided from the reset signal terminal and the high level signal provided from the high-level signal terminal.

According to an embodiment of the present disclosure, there is provided a shift register including a first transistor, a second transistor, a third transistor, a fourth transistor, a fifth transistor, a sixth transistor, a seventh transistor, an eighth transistor, a ninth transistor, a first storage capacitor, a second storage capacitor, a third storage capacitor, a signal input terminal, a high-level signal terminal, a low-level signal terminal, a reset signal terminal, a signal output terminal, a first clock signal terminal, and a second clock signal terminal, where, a first electrode of the first transistor is electrically coupled to the high-level signal terminal, a second electrode of the first transistor is electrically coupled to a first electrode of the second transistor, and a control electrode of the first transistor is electrically coupled to the first clock signal terminal; the first electrode of the second transistor is respectively electrically coupled to the second electrode of the first transistor, a second electrode of the second transistor is electrically coupled to control electrodes of the fourth transistor and the fifth transistor, first electrodes of the sixth transistor and the ninth transistor, and a second terminal of the third storage capacitor, respectively, and a control electrode of the second transistor is electrically coupled to the second clock signal terminal; a first electrode of the third transistor is electrically coupled to the first clock signal terminal, a second electrode of the third transistor is electrically coupled to a second terminal of the first storage capacitor and the signal output terminal, respectively, and a control electrode of the third transistor is electrically coupled to a second electrode of the eighth transistor and a first terminal of the first storage capacitor, respectively; a first electrode of the fourth transistor is electrically coupled to the signal output terminal, a second electrode of the fourth transistor is electrically coupled to the low-level signal terminal, and a control electrode of the fourth transistor is electrically coupled to the first electrode of the ninth transistor, the control electrode of the fifth transistor, the first electrode of the sixth transistor, the second electrode of the second transistor, and the second terminal of the third storage capacitor, respectively; a first electrode of the fifth transistor is electrically coupled to a second electrode of the seventh transistor and a first electrode of the eighth transistor, respectively; a second electrode of the fifth transistor is electrically coupled to the low-level signal terminal, and the control electrode of the fifth transistor is electrically coupled to the first electrode of the ninth transistor, the control electrode of the fourth transistor, the first electrode of the sixth transistor, the second electrode of the second transistor, and the second terminal of the third storage capacitor, respectively; the first electrode of the sixth transistor is electrically coupled to the first electrode of the ninth transistor, the control electrodes of the fourth transistor and the fifth transistor, the second electrode of the second transistor, and the second terminal of the third storage capacitor, respectively, a second electrode of the sixth transistor is electrically coupled to the low-level signal terminal, and a control electrode of the sixth transistor is electrically coupled to the signal input terminal; a first electrode and a control electrode of the seventh transistor are both electrically coupled to the signal input terminal, and the second electrode of the seventh transistor is electrically coupled to the first electrodes of the fifth transistor and the eighth transistor; the first electrode of the eighth transistor is electrically coupled to the second electrode of the seventh transistor and the first electrode of the fifth transistor, respectively, the second electrode of the eighth transistor is electrically coupled to the control electrode of the third transistor and the first terminal of the first storage capacitor, respectively, a control electrode of the eighth transistor is electrically coupled to the high-level signal terminal; the first electrode of the ninth transistor is electrically coupled to the control electrode of the fifth transistor, the first electrode of the sixth transistor, the second electrode of the second transistor, the control electrode of the fourth transistor, and the second terminal of the third storage capacitor, respectively, a second electrode of the ninth transistor is electrically coupled to the high-level signal terminal, and a control electrode of the ninth transistor is electrically coupled to the reset signal terminal; the first terminal of the first storage capacitor is electrically coupled to the control electrode of the third transistor and the second electrode of the eighth transistor, respectively, and the second terminal of the first storage capacitor is electrically coupled to the second electrode of the third transistor, the first electrode of the fourth transistor, and the signal output terminal, respectively; a first terminal of the second storage capacitor is electrically coupled to the low-level signal terminal, and a second terminal is electrically coupled between the second electrode of the first transistor and the first electrode of the second transistor; a first terminal of the third storage capacitor is electrically coupled to the low-level signal terminal, and the second terminal of the third storage capacitor is electrically coupled to the control electrode of the fifth transistor, the first electrode of the sixth transistor, the second electrode of the second transistor, the control electrode of the fourth transistor and the first electrode of the ninth transistor, respectively.

DETAILED DESCRIPTION

In order to make those skilled in the art to better understand the technical solutions of the present disclosure, the technical solutions of the present disclosure will be further described in detail below with reference to the accompanying drawings and specific embodiments.

Transistors used in the embodiments of the present disclosure may be thin film transistors or field effect transistors, or other devices with same characteristics. Since a source of a transistor and a drain of the transistor are interchangeable under a certain condition, there is no difference in the description of a connection relationship between the source and the drain. In the embodiments of the present disclosure, in order to distinguish the source and the drain of the transistor, one of the source and the drain is referred to as a first electrode, the other one of the source and the drain is referred to as a second electrode, and a gate of the transistor is referred to as a control electrode. Further, the transistors can be classified into an N-type and a P-type according to the characteristics of the transistors, and the following embodiments are describes by taking the transistors being N-type transistors as examples. When an N-type transistor is adopted, the first electrode is the drain of the N-type transistor and the second electrode is the source of the N-type transistor, and the transistor is conductive between the source and the drain when a high level is input to the gate of the transistor. In contrast, for a P-type transistor, it is conductive between the source and the drain when a low level is applied to the gate of the transistor. It is conceivable that the implementation of the technical solution of the present disclosure by using a P-type transistor can be easily conceived by those skilled in the art without any creative work, and thus is also within the scope of the present disclosure.

In a gate driving circuit, one electrode of each shift register is electrically coupled to one gate line, such that the gate driving circuit outputs a scan signal to gate lines, thereby implementing progressive scanning of pixels.

Figure 1:
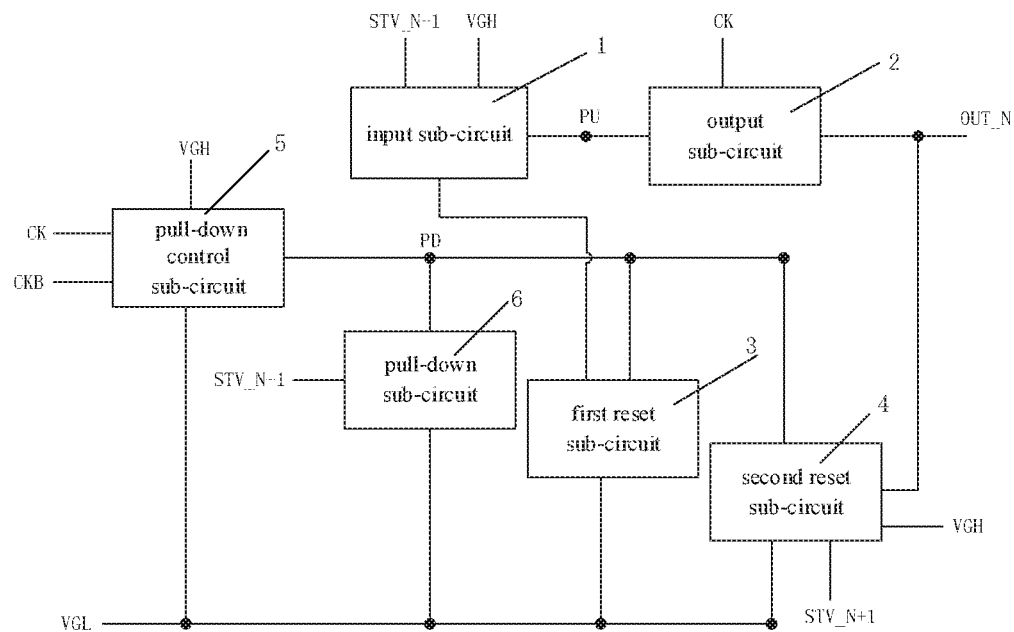
FIG. 1 is a schematic diagram of a structure of a shift register according to an embodiment of the present disclosure.
Figure 2:
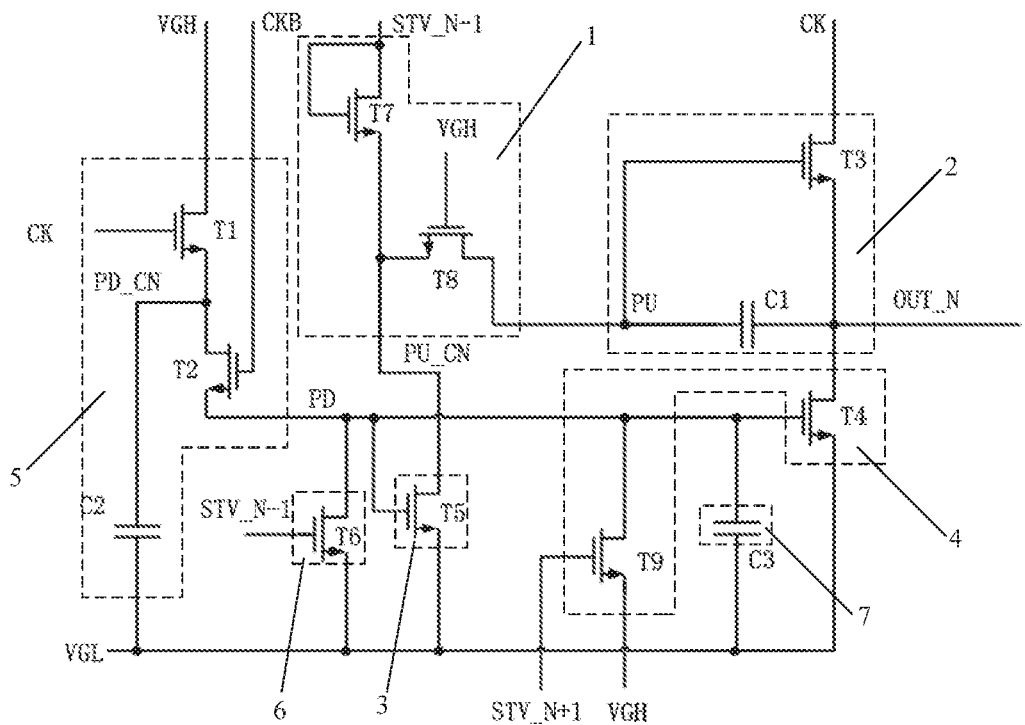
FIG. 2 is a circuit diagram of a shift register according to an embodiment of the present disclosure.

As shown in FIG. 1 and FIG. 2, there is provided a shift register in an embodiment of the present disclosure, including: an input sub-circuit 1, an output sub-circuit 2, a pull-down control sub-circuit 5, a pull-down sub-circuit 6, a first reset sub-circuit 3 and a second reset sub-circuit 4, a signal input terminal STV_N−1, a high-level signal terminal VGH, a low-level signal terminal VGL, a reset signal terminal STV_N+1, a signal output terminal OUT_N, a first clock signal terminal CK and a second clock signal terminal CKB, The input sub-circuit 1 is configured to charge a pull-up node PU under the control of an input signal provided from the signal input terminal STV_N−1. The pull-up node PU is a connection node between the input sub-circuit 1 and the output sub-circuit 2. The output sub-circuit 2 is configured to output, under the control of a potential of the pull-up node PU, a first clock signal provided from the first clock signal terminal CK via the signal output terminal OUT_N. The pull-down control sub-circuit 5 is configured to charge a pull-down node PD under the control of the first clock signal provided from the first clock signal terminal CK and a second clock signal provided from the second clock signal terminal CKB, The pull-down node PD is a connection node between the pull-down control sub-circuit 5, the pull-down sub-circuit 6, the first reset sub-circuit 3, and the second reset sub-circuit 4. The pull-down sub-circuit 6 is configured to pull-down, under a control of the input signal provided from the signal input terminal STV_N−1, a potential of the pull-down node PD by a low level signal provided from the low-level signal terminal VGL. The first reset sub-circuit 3 is configured to discharge, under the control of the potential of the pull-down node PD, the pull-up node PU by the low-level signal provided from the low-level signal terminal VGL. The second reset sub-circuit 4 is configured to discharge, under the control of the potential of the pull-down node PD and a reset signal provided from the reset signal terminal STV_N+1, the signal output terminal OUT_N by the low-level signal provided from the low-level signal terminal VGL.

In the shift register of the present embodiment, since the pull-down control sub-circuit 5 charges the pull-down node PD under the control of two clock signals (that is, the first clock signal and the second clock signal), avoiding a direct current path due to direct charging the pull-down node PD under the control of one clock signal in related art and a problem of the stability of the shift register being affected.

In some implementations, the pull-down control sub-circuit 5 may include a first transistor T1, a second transistor T2, and a second storage capacitor C2. A first electrode of the first transistor T1 is electrically coupled to the high-level signal terminal VGH, a second electrode of the first transistor T1 is electrically coupled to a first electrode of the second transistor T2, and a control electrode of the first transistor T1 is electrically coupled to the first clock signal terminal CK. The first electrode of the second transistor T2 is electrically coupled to the second electrode of the first transistor T1, a second electrode of the second transistor T2 is electrically coupled to the pull-down node PD, and a control electrode of the second transistor T2 is electrically coupled to the second clock signal terminal CKB, A first terminal of the second storage capacitor C2 is electrically coupled to the low-level signal terminal VGL, and a second terminal of the second storage capacitor C2 is electrically coupled between the second electrode of the first transistor T1 and the first electrode of the second transistor T2.

Specifically, the first clock signal and the second clock signal are both pulse signals, and a phase difference between the two clock signals is half a cycle, that is, when the first clock signal is at a high level, the second clock signal is at a low level, and when the first clock signal is at a low level, the second clock signal is at a high level. In this way, when the first clock signal is at a high level, the first transistor T1 is turned on, and a pull-down control node PDSN and the second storage capacitor C2 are charged by a high level signal input from the high-level signal terminal VGH. When the second clock signal is at a high level and the first clock signal is at a low level, the second transistor T2 is turned on, the first transistor T1 is turned off, and the second storage capacitor C2 is discharged, thereby pulling up the potential of the pull-down node PD.

In some implementations, the pull-down sub-circuit 6 includes a sixth transistor T6. A first electrode of the sixth transistor T6 is electrically coupled to the pull-down node PD, a second electrode of the sixth transistor T6 is electrically coupled to the low-level signal terminal VGL, and a control electrode of the sixth transistor T6 is electrically coupled to the signal input terminal STV_N−1.

Specifically, in an input stage of the shift register, a high level signal is input to the signal input terminal STV_N−1 and the sixth transistor T6 is turned on. At this time, the pull-down node PD may be pulled down by the low level signal written through the low-level signal terminal VGL to be discharged.

In some implementations, the input sub-circuit 1 includes a seventh transistor T7. A first electrode and a control electrode of the seventh transistor T7 are both electrically coupled to the signal input terminal STV_N−1, and a second electrode of the seventh transistor T7 is electrically coupled to the pull-up node PU and the first reset sub-circuit 3, respectively.

Specifically, in the input stage, a high level signal is input to the signal input terminal STV_N−1, and the seventh transistor T7 is turned on to charge the pull-up node PU. In the present embodiment, in order to ensure the stability of the potential of the pull-up node PU, an eighth transistor T8 is further provided in the input sub-circuit 1. A first electrode of the eighth transistor T8 is respectively electrically coupled to the second electrode of the seventh transistor T7 and the first reset sub-circuit 3, a second electrode of the eighth transistor T8 is electrically coupled to the pull-up node PU, and a control electrode of the eighth transistor T8 is electrically coupled to the high-level signal terminal VGH. Since the control electrode of the eighth transistor T8 is electrically coupled to the high-level signal terminal VGH, that is, a high level signal is continuously written to the control electrode of the eighth transistor T8, the eighth transistor T8 is in a normally-on state, which is equivalent to an unidirectional conduction of a diode, such that leakage current due to the potential of the pull-up node PU, which is high to a certain extent, is prevented from occurring.

In some implementations, the output sub-circuit 2 includes a third transistor T3 and a first storage capacitor C1. A first electrode of the third transistor T3 is electrically coupled to the first clock signal terminal CK, a second electrode of the third transistor T3 is electrically coupled to a second terminal of the first storage capacitor C1 and the signal output terminal OUT_N, and a control electrode of the third transistor T3 is electrically coupled to the pull-up node PU and a first terminal of the first storage capacitor C1.

Specifically, after the pull-up node PU is pre-charged to a high level, the third transistor T3 is turned on, a high level signal is written to the first clock signal terminal CK, and a high level signal is output from the signal output terminal OUT_N.

In some implementations, the first reset sub-circuit 3 includes a fifth transistor T5. A first electrode of the fifth transistor T5 is electrically coupled to the pull-up node PU via the input sub-circuit 1, a second electrode of the fifth transistor T5 is electrically coupled to the low-level signal terminal VGL, and a control electrode of the fifth transistor 15 is electrically coupled to the pull-down node PD.

Specifically, when the pull-down node PD is charged to a high level, the fifth transistor T5 is turned on, at which time the potential of the pull-up control node PU_CN is pulled low. Since the eighth transistor T8 is in a normally-on state, and the potential of the pull-up node PU is also pulled down, thereby completing the reset of the pull-up node PU.

In some implementations, the second reset sub-circuit 4 includes a fourth transistor T4 and a ninth transistor T9. A first electrode of the fourth transistor T4 is electrically coupled to the signal output terminal OUT_N, a second electrode of the fourth transistor T4 is electrically coupled to the low-level signal terminal VGL, and a control electrode is electrically coupled to a first electrode of the ninth transistor T9 and the pull-down node PD. The first electrode of the ninth transistor T9 is electrically coupled to the control electrode of the fourth transistor T4 and the pull-down node PD, a second electrode of the ninth transistor T9 is electrically coupled to the high-level signal terminal VGH, and a control electrode of the ninth transistor T9 is electrically coupled to the reset signal terminal STV_N+1.

Specifically, in a reset stage, a high level signal is input to the reset signal terminal STV_N+1, and the ninth transistor T9 is turned on, such that the high level signal written from the high-level signal terminal VGH is written to the control electrode of the fourth transistor T4 to turn on the fourth transistor 14, thereby resetting the signal output terminal OUT_N by the low level signal written from the low-level signal terminal VGL.

Certainly, the shift register in an embodiment of the present disclosure may further include: a storage sub-circuit 7, that is, a third storage capacitor C3. A first terminal of the third storage capacitor C3 is electrically coupled to the low-level signal terminal VGL, and a second terminal of the third storage capacitor C3 is electrically coupled to the pull-down node PD, and the third storage capacitor C3 is configured to maintain the potential of the pull-down node PD.

Figure 4:
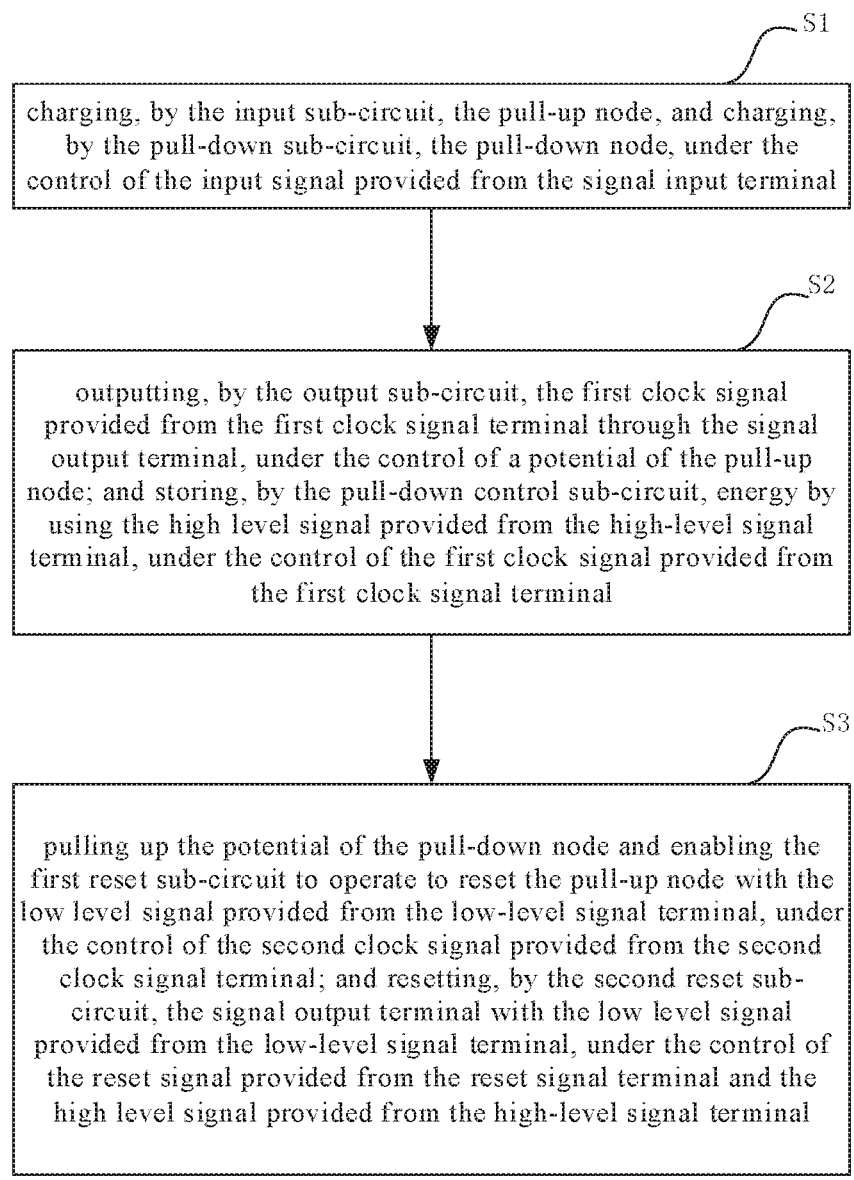
FIG. 4 is a flowchart of a method for driving a shift register according to an embodiment of the present disclosure.

A method for driving the shift register in the embodiment of the present disclosure will be described below. As shown in FIG. 4, the method specifically includes the following stages S1 to S3.

In the first stage S1, that is, in an input stage, an input signal is at a high level, the pull-up node PU is pre-charged by the input sub-circuit 1, and a potential of the pull-down node PD is pulled down by the pull-down sub-circuit 6, that is, the pull-down node PD is discharged.

In the second stage S2, that is, in an output stage, since the pull-up node PU is charged to a high level in the previous stage, the output sub-circuit 2 operates and outputs a high level signal written by the first clock signal. Since the first clock signal is at a high level, the pull-down control sub-circuit 5 stores energy at this stage.

In the third stage S3, that is, in a reset stage, the second clock signal is at a high level. At this time, the pull-down control sub-circuit 5 releases charges stored in the previous stage and the potential of the pull-down node PD is pulled up. The first reset sub-circuit 3 operates and pulls down the potential of the pull-up node PU by a low level signal. Since a reset signal is at a high-level, the second reset sub-circuit 4 operates, and the potential of the signal output terminal OUT_N is pulled down by the low-level signal, thereby completing the reset of the pull-up node PU and the signal output OUT_N.

Figure 3:
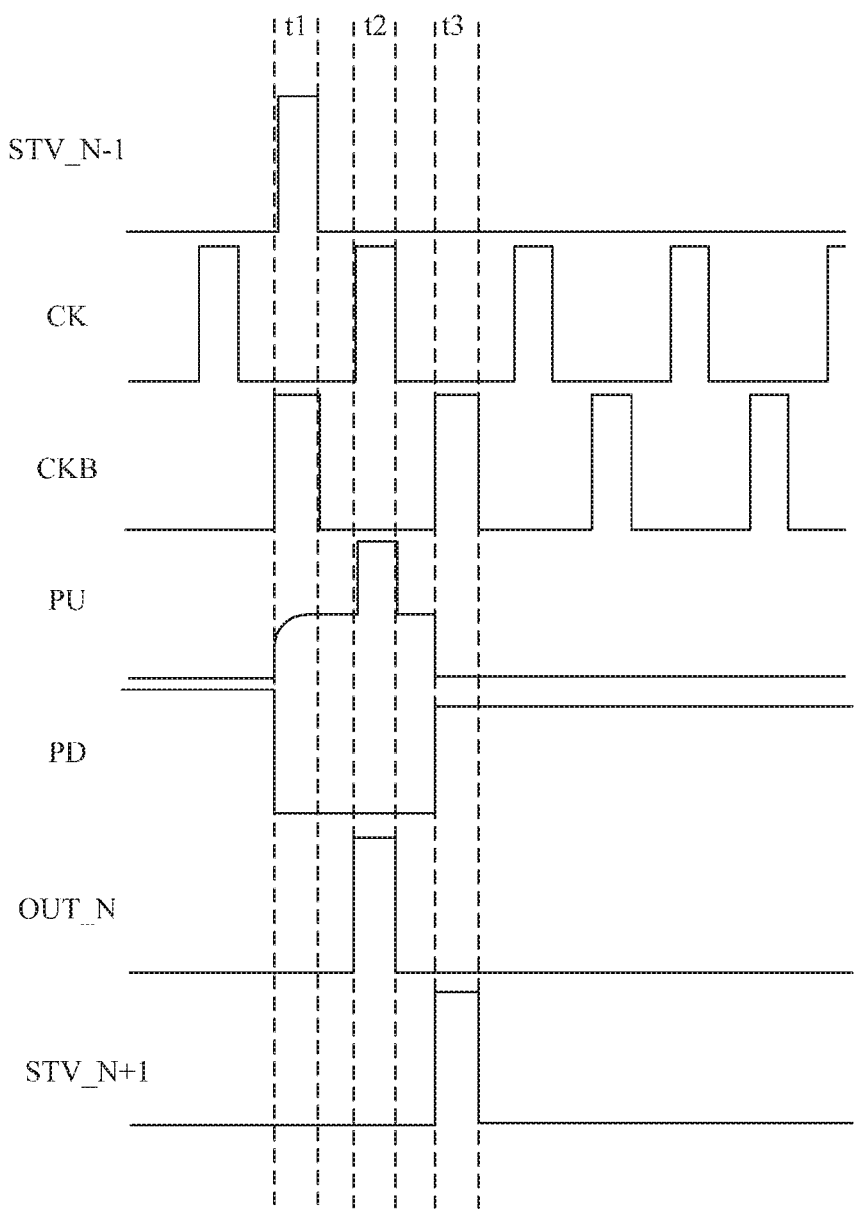
FIG. 3 is a timing diagram of an operation of the shift register in FIG. 2.

In order to more clearly explain the method for driving the shift register in the embodiment of the present disclosure, it will be described with reference to FIG. 2 and FIG. 3. As shown in FIG. 2 and FIG. 3, in the shift register, a pull-down control sub-circuit 5 includes a first transistor T1, a second transistor 12, and a second storage capacitor C2. A pull-down sub-circuit 6 includes a sixth transistor 16. An input sub-circuit 1 includes a seventh transistor 17 and an eighth transistor 18. An output sub-circuit 2 includes a third transistor T3 and a first storage capacitor C1. A first reset sub-circuit 3 includes a fifth transistor T5. A second reset sub-circuit 4 includes a fourth transistor T4 and a ninth transistor T9. A first electrode of the first transistor T1 is electrically coupled to a high-level signal terminal VGH, a second electrode of the first transistor T1 is electrically coupled to a first electrode of the second transistor 12, and a control electrode of the first transistor T1 is electrically coupled to a first clock signal terminal CK. The first electrode of the second transistor T2 is electrically coupled to the second electrode of the first transistor T1, a second electrode of the second transistor T2 is electrically coupled to a pull-down node PD, and a control electrode of the second transistor T2 is electrically coupled to a second clock signal terminal CKB. A first terminal of the second storage capacitor C2 is electrically coupled to a low-level signal terminal VGL, and a second terminal of the second storage capacitor C2 is electrically coupled between the second electrode of the first transistor T1 and the first electrode of the second transistor T2. A first electrode of the sixth transistor T6 is electrically coupled to a pull-down node PD, a second electrode of the sixth transistor T6 is electrically coupled to the low-level signal terminal VGL, and a control electrode of the sixth transistor T6 is electrically coupled to a signal input terminal STV_N−1. A first electrode and a control electrode of the seventh transistor T7 are both electrically coupled to the signal input terminal STV_N−1, and a second electrode of the seventh transistor T7 is electrically coupled to a first electrode of the eighth transistor T8 and a first electrode of the fifth transistor 15. A first electrode of the eighth transistor 18 is electrically coupled to the second electrode of the seventh transistor 17 and the first electrode of the fifth transistor T5, the second electrode of the eighth transistor 18 is electrically coupled to a pull-up node PU, and a control electrode of the eighth transistor T8 is electrically coupled to the high-level signal terminal VGH. A first electrode of the third transistor 13 is electrically coupled to the first clock signal terminal CK, a second electrode of the third transistor 13 is electrically coupled to a second terminal of the first storage capacitor C1 and a signal output terminal OUT_N, and a control electrode of the third transistor 13 is electrically coupled to the pull-up node PU and a first terminal of the storage capacitor C1. The first electrode of the fifth transistor is electrically coupled to the pull-up node PU through the eighth transistor 18, the second electrode of the fifth transistor is electrically coupled to the low-level signal terminal VGL, and a control electrode of the fifth transistor is electrically coupled to the pull-down node PD. A first electrode of the fourth transistor T4 is electrically coupled to the signal output terminal OUT_N, a second electrode of the fourth transistor 14 is electrically coupled to the low-level signal terminal VGL, and a control electrode of the fourth transistor T4 is electrically coupled to a first electrode of the ninth transistor T9 and the pull-down node PD. The first electrode of the ninth transistor T9 is electrically coupled to the control electrode of the fourth transistor T4 and the pull-down node PD, a second electrode of the ninth transistor T9 is electrically coupled to the high-level signal terminal VGH, and a control electrode of the ninth transistor T9 is electrically coupled to the reset signal terminal STV_N+1. The shift register may also include a storage sub-circuit 7, that is, a third storage capacitor C3. A first terminal of the third storage capacitor C3 is electrically coupled to the low-level signal terminal VGL, and a second terminal of the third storage capacitor C3 is electrically coupled to the pull-down node PD, and the third storage capacitor C3 is configured to maintain the potential of the pull-down node PD.

A method for driving the shift register specifically includes the following stages S1 to S3.

In the first stage S1, that is, in an input stage, a high level signal is input from the signal input terminal STV_N−1, and the sixth transistor T6 and the seventh transistor T7 are both turned on. The control electrode of the eighth transistor T8 is electrically coupled to the high-level signal terminal VGH and thus is in a normally-on state. Therefore, the pull-up control node PU_CN and the pull-up node PU are pre-charged in this stage. Since the sixth transistor T6 is turned on, the pull-down node PD may be discharged by the low-level signal input from the low-level signal terminal VGL.

In the second stage S2, that is, in an output stage, a first clock signal is at a high level. Since the pull-up node PU is pre-charged to a high level in the previous stage, the pull-up node PU is further pulled up due to bootstrap of the first storage capacitor C1, thus the third transistor T3 is turned on, and the first clock signal is output through the third transistor T3, that is, the signal output terminal OUT_N outputs a high level signal. In addition, the first transistor T1 is turned on, and the pull-down control node PD_CN is charged.

In the third stage S3, that is, in a reset stage, a second clock signal is at a high level, and the second transistor T2 is turned on. Since the pull-down control node PD_CN is charged in the previous stage, a potential of the pull-clown node PD is pulled up at this time. In this way, the fifth transistor T5 is turned on, and the pull-up control node PU_CN and the pull-up node PU are pulled down by a low level signal to be discharged. Since a high level signal is input to the reset signal terminal STV_N+1, the ninth transistor T9 and the fourth transistor T4 are turned on, and the signal output terminal OUT_N is pulled down by a low level signal to be discharged, thereby completing the reset of the pull-up control node PU_CN, the pull-up node PU and the signal output terminal OUT_N.

Figure 5:
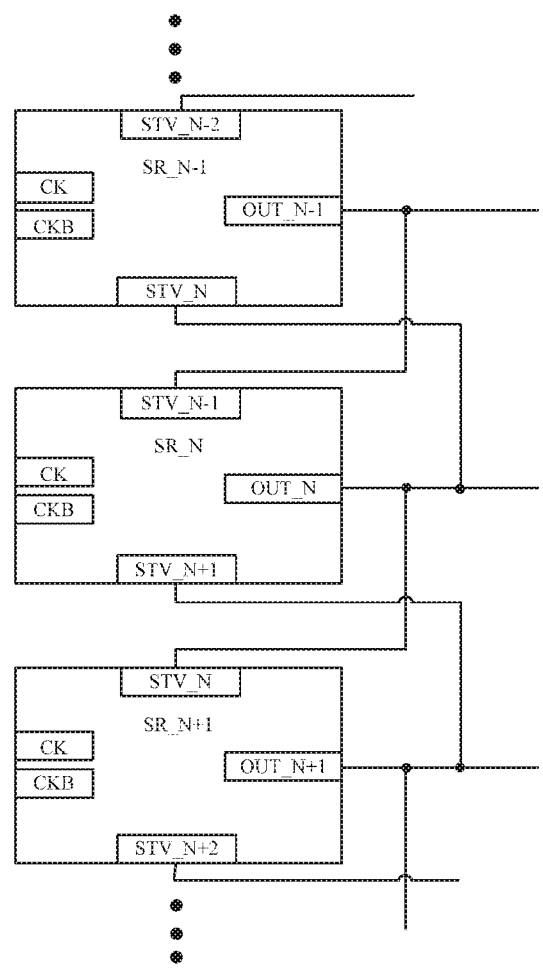
FIG. 5 is a schematic diagram of a structure of a gate driving circuit according to an embodiment of the present disclosure.

Embodiments of the present disclosure also provide a gate driving circuit including a plurality of shift registers which are cascaded, and each of the shift registers is the shift register described in the embodiments of the present disclosure, as shown in FIG. 5. A signal input terminal STV_N−1 of a shift register SR_N in a current stage is electrically coupled to a signal output terminal OUT_N−1 of a shift register SR_N−1 in a previous stage; a reset signal terminal STV_N+1 of the shift register SR_N in the current stage is electrically coupled to a signal output terminal OUT_N+1 of a shift register SR_N+1 in a next stage.

Since the gate driving circuit in the present embodiment includes the shift register described in the embodiments of the present disclosure, its performance is better.

Embodiments of the present disclosure also provide a display device including the above-described gate driving circuit. Since the display device includes the above-described gate driving circuit, its performance can be better. The display device can be any product or component having display function, such as a mobile phone, a tablet computer, a television, a display, a notebook computer, a digital photo frame, a navigator, and the like.

Certainly, the display device in the present embodiment may further include other conventional structures, such as a power source, a display driving circuit, and the like.

It should be understood that, the above embodiments and implementations are merely exemplary embodiments and implementations for explaining principle of the present disclosure, but the present disclosure is not limited thereto. Various modifications and variants may be made by those ordinary skilled in the art within the spirit and essence of the present disclosure, these modifications and variants fall into the protection scope of the present disclosure.

What is claimed is:

1. A shift register comprising an input sub-circuit, an output sub-circuit, a pull-down control sub-circuit, a pull-down sub-circuit, a first reset sub-circuit, a second reset sub-circuit, a signal input terminal, a high-level signal terminal, a low-level signal terminal, a reset signal terminal, a signal output terminal, a first clock signal terminal and a second clock signal terminal, wherein the input sub-circuit is configured to charge, under the control of an input signal provided from the signal input terminal, a pull-up node, which is a connection node between the input sub-circuit and the output sub-circuit;

the output sub-circuit is configured to output, under the control of a potential of the pull-up node, a first clock signal provided from the first clock signal terminal through the signal output terminal;

the pull-down control sub-circuit is configured to charge, under the control of the first clock signal provided from the first clock signal terminal and a second clock signal provided from the second clock signal terminal, a pull-down node, which is a connection node between the pull-down control sub-circuit, the pull-down sub-circuit, the first reset sub-circuit, and the second reset sub-circuit;

the pull-down sub-circuit is configured to pull-down, under the control of the input signal provided from the signal input terminal, a potential of the pull-down node by a low level signal provided from the low-level signal terminal;

the first reset sub-circuit is configured to discharge, under the control of the potential of the pull-down node, the pull-up node by the low level signal provided from the low-level signal terminal; and the second reset sub-circuit is configured to discharge, under the control of the potential of the pull-down node and a reset signal provided from the reset signal terminal, the signal output terminal by the low level signal provided from the low-level signal terminal.

2. The shift register of claim 1, wherein the pull-down control sub-circuit comprises a first transistor, a second transistor, and a second storage capacitor, and wherein a first electrode of the first transistor is electrically coupled to the high-level signal terminal, a second electrode of the first transistor is electrically coupled to a first electrode of the second transistor, and a control electrode of the first transistor is electrically coupled to the first clock signal terminal;

the first electrode of the second transistor is electrically coupled to the second electrode of the first transistor, a second electrode of the second transistor is electrically coupled to the pull-down node, and a control electrode of the second transistor is electrically coupled to the second clock signal terminal;

a first terminal of the second storage capacitor is electrically coupled to the low-level signal terminal, and a second terminal of the second storage capacitor is electrically coupled between the second electrode of the first transistor and the first electrode of the second transistor.

3. The shift register of claim 1, wherein the pull-down sub-circuit comprises a sixth transistor, and wherein a first electrode of the sixth transistor is electrically coupled to the pull-down node, a second electrode of the sixth transistor is electrically coupled to the low-level signal terminal, and a control electrode of the sixth transistor is electrically coupled to the signal input terminal.

4. The shift register of claim 1, wherein the input sub-circuit comprises a seventh transistor, and wherein a first electrode and a control electrode of the seventh transistor are both electrically coupled to the signal input terminal, and a second electrode of the seventh transistor is electrically coupled to the pull-up node and the first reset sub-circuit.

5. The shift register of claim 4, wherein the input sub-circuit further comprises an eighth transistor, and wherein a first electrode of the eighth transistor is electrically coupled to the second electrode of the seventh transistor and the first reset sub-circuit, a second electrode of the eighth transistor is electrically coupled to the pull-up node, and a control electrode of the eighth transistor is electrically coupled to the high-level signal terminal.

6. The shift register of claim 1, wherein the output sub-circuit comprises a third transistor and a first storage capacitor, and wherein a first electrode of the third transistor is electrically coupled to the first clock signal terminal, a second electrode of the third transistor is electrically coupled to a second terminal of the first storage capacitor and the signal output terminal, and a control electrode of the third transistor is electrically coupled to the pull-up node and a first terminal of the first storage capacitor.

7. The shift register of claim 1, wherein the first reset sub-circuit comprises a fifth transistor, and wherein a first electrode of the fifth transistor is electrically coupled to the pull-up node via the input sub-circuit, a second electrode of the fifth transistor is electrically coupled to the low-level signal terminal, and a control electrode of the fifth transistor is electrically coupled to the pull-down node.

8. The shift register of claim 1, wherein the second reset sub-circuit comprises a fourth transistor and a ninth transistor, and wherein a first electrode of the fourth transistor is electrically coupled to the signal output terminal, a second electrode of the fourth transistor is electrically coupled to the low-level signal terminal, and a control electrode of the fourth transistor is electrically coupled to a first electrode of the ninth transistor and the pull-down node;

the first electrode of the ninth transistor is electrically coupled to the control electrode of the fourth transistor and the pull-down node, a second electrode of the ninth transistor is electrically coupled to the high-level signal terminal, and a control electrode of the ninth transistor is electrically coupled to the reset signal terminal.

9. The shift register of claim 1, further comprising a third storage capacitor, wherein
a first terminal of the third storage capacitor is electrically coupled to the low-level signal terminal, and a second terminal of the third storage capacitor is electrically coupled to the pull-down node.

10. A gate driving circuit comprising a plurality of shift registers which are cascaded, and each of the shift registers is the shift register of claim 1, wherein
a signal input terminal of a shift register of a current stage is electrically coupled to a signal output terminal of a shift register of a previous stage;
a reset signal terminal of the shift register of the current stage is electrically coupled to a signal output terminal of a shift register of a next stage.

11. A display device comprising the gate driving circuit of claim 10.

12. A method for driving the shift register of claim 1, the method comprising a first stage, a second stage and a third stage, wherein
in the first stage, charging, by the input sub-circuit, the pull-up node, and charging, by the pull-down sub-circuit, the pull-down node, under the control of the input signal provided from the signal input terminal;
in the second stage, outputting, by the output sub-circuit, the first clock signal provided from the first clock signal terminal through the signal output terminal, under the control of a potential of the pull-up node; and storing, by the pull-down control sub-circuit, energy by using the high level signal provided from the high-level signal terminal, under the control of the first clock signal provided from the first clock signal terminal;
in the third stage, pulling up the potential of the pull-down node and enabling the first reset sub-circuit to operate to reset the pull-up node with the low level signal provided from the low-level signal terminal, under the control of the second clock signal provided from the second clock signal terminal; and resetting, by the second reset sub-circuit, the signal output terminal with the low level signal provided from the low-level signal terminal, under the control of the reset signal provided from the reset signal terminal and the high level signal provided from the high-level signal terminal.

13. A shift register comprising a first transistor, a second transistor, a third transistor, a fourth transistor, a fifth transistor, a sixth transistor, a seventh transistor, an eighth transistor, a ninth transistor, a first storage capacitor, a second storage capacitor, a third storage capacitor, a signal input terminal, a high-level signal terminal, a low-level signal terminal, a reset signal terminal, a signal output terminal, a first clock signal terminal, and a second clock signal terminal, wherein
a first electrode of the first transistor is electrically coupled to the high-level signal terminal, a second electrode of the first transistor is electrically coupled to a first electrode of the second transistor, and a control electrode of the first transistor is electrically coupled to the first clock signal terminal;
the first electrode of the second transistor is respectively electrically coupled to the second electrode of the first transistor, a second electrode of the second transistor is electrically coupled to control electrodes of the fourth transistor and the fifth transistor, first electrodes of the sixth transistor and the ninth transistor, and a second terminal of the third storage capacitor, respectively, and a control electrode of the second transistor is electrically coupled to the second clock signal terminal;
a first electrode of the third transistor is electrically coupled to the first clock signal terminal, a second electrode of the third transistor is electrically coupled to a second terminal of the first storage capacitor and the signal output terminal, respectively, and a control electrode of the third transistor is electrically coupled to a second electrode of the eighth transistor and a first terminal of the first storage capacitor, respectively;
a first electrode of the fourth transistor is electrically coupled to the signal output terminal, a second electrode of the fourth transistor is electrically coupled to the low-level signal terminal, and a control electrode of the fourth transistor is electrically coupled to the first electrode of the ninth transistor, the control electrode of the fifth transistor, the first electrode of the sixth transistor, the second electrode of the second transistor, and the second terminal of the third storage capacitor, respectively;
a first electrode of the fifth transistor is electrically coupled to a second electrode of the seventh transistor and a first electrode of the eighth transistor, respectively; a second electrode of the fifth transistor is electrically coupled to the low-level signal terminal, and the control electrode of the fifth transistor is electrically coupled to the first electrode of the ninth transistor, the control electrode of the fourth transistor, the first electrode of the sixth transistor, the second electrode of the second transistor, and the second terminal of the third storage capacitor, respectively;
the first electrode of the sixth transistor is electrically coupled to the first electrode of the ninth transistor, the control electrodes of the fourth transistor and the fifth transistor, the second electrode of the second transistor, and the second terminal of the third storage capacitor, respectively, a second electrode of the sixth transistor is electrically coupled to the low-level signal terminal, and a control electrode of the sixth transistor is electrically coupled to the signal input terminal;
a first electrode and a control electrode of the seventh transistor are both electrically coupled to the signal input terminal, and the second electrode of the seventh transistor is electrically coupled to the first electrodes of the fifth transistor and the eighth transistor;
the first electrode of the eighth transistor is electrically coupled to the second electrode of the seventh transistor and the first electrode of the fifth transistor, respectively, the second electrode of the eighth transistor is electrically coupled to the control electrode of the third transistor and the first terminal of the first storage capacitor, respectively, a control electrode of the eighth transistor is electrically coupled to the high-level signal terminal;
the first electrode of the ninth transistor is electrically coupled to the control electrode of the fifth transistor, the first electrode of the sixth transistor, the second electrode of the second transistor, the control electrode of the fourth transistor, and the second terminal of the third storage capacitor, respectively, a second electrode of the ninth transistor is electrically coupled to the high-level signal terminal, and a control electrode of the ninth transistor is electrically coupled to the reset signal terminal;
the first terminal of the first storage capacitor is electrically coupled to the control electrode of the third transistor and the second electrode of the eighth transistor, respectively, and the second terminal of the first storage capacitor is electrically coupled to the second electrode of the third transistor, the first electrode of the fourth transistor, and the signal output terminal, respectively;
- a first terminal of the second storage capacitor is electrically coupled to the low-level signal terminal, and a second terminal is electrically coupled between the second electrode of the first transistor and the first electrode of the second transistor;
- a first terminal of the third storage capacitor is electrically coupled to the low-level signal terminal, and the second terminal of the third storage capacitor is electrically coupled to the control electrode of the fifth transistor, the first electrode of the sixth transistor, the second electrode of the second transistor, the control electrode of the fourth transistor and the first electrode of the ninth transistor, respectively.

14. The shift register of claim 2, wherein the pull-down sub-circuit comprises a sixth transistor, and wherein
- a first electrode of the sixth transistor is electrically coupled to the pull-down node, a second electrode of the sixth transistor is electrically coupled to the low-level signal terminal, and a control electrode of the sixth transistor is electrically coupled to the signal input terminal.

15. The shift register of claim 14, wherein the input sub-circuit comprises a seventh transistor, and wherein
- a first electrode and a control electrode of the seventh transistor are both electrically coupled to the signal input terminal, and a second electrode of the seventh transistor is electrically coupled to the pull-up node and the first reset sub-circuit.

16. The shift register of claim 15, wherein the input sub-circuit further comprises an eighth transistor, and wherein
- a first electrode of the eighth transistor is electrically coupled to the second electrode of the seventh transistor and the first reset sub-circuit, a second electrode of the eighth transistor is electrically coupled to the pull-up node, and a control electrode of the eighth transistor is electrically coupled to the high-level signal terminal.

17. The shift register of claim 16, wherein the output sub-circuit comprises a third transistor and a first storage capacitor, and wherein
- a first electrode of the third transistor is electrically coupled to the first clock signal terminal, a second electrode of the third transistor is electrically coupled to a second terminal of the first storage capacitor and the signal output terminal, and a control electrode of the third transistor is electrically coupled to the pull-up node and a first terminal of the first storage capacitor.

18. The shift register of claim 17, wherein the first reset sub-circuit comprises a fifth transistor, and wherein
- a first electrode of the fifth transistor is electrically coupled to the pull-up node via the input sub-circuit, a second electrode of the fifth transistor is electrically coupled to the low-level signal terminal, and a control electrode of the fifth transistor is electrically coupled to the pull-down node.

19. The shift register of claim 18, wherein the second reset sub-circuit comprises a fourth transistor and a ninth transistor, and wherein
- a first electrode of the fourth transistor is electrically coupled to the signal output terminal, a second electrode of the fourth transistor is electrically coupled to the low-level signal terminal, and a control electrode of the fourth transistor is electrically coupled to a first electrode of the ninth transistor and the pull-down node;
- the first electrode of the ninth transistor is electrically coupled to the control electrode of the fourth transistor and the pull-down node, a second electrode of the ninth transistor is electrically coupled to the high-level signal terminal, and a control electrode of the ninth transistor is electrically coupled to the reset signal terminal.

20. The shift register of claim 2, further comprising a third storage capacitor, wherein
- a first terminal of the third storage capacitor is electrically coupled to the low-level signal terminal, and a second terminal of the third storage capacitor is electrically coupled to the pull-down node.

* * * * *